Aug. 22, 1961 W. F. BARLOW 2,997,656

GAIN CONTROL FOR TRANSISTOR DETECTOR OR AMPLIFIER

Filed June 9, 1959

Walter Frederick Barlow
INVENTOR

BY: Mead, Browne, Schuyler & Beveridge
ATTORNEYS

United States Patent Office 2,997,656

Patented Aug. 22, 1961

2,997,656

GAIN CONTROL FOR TRANSISTOR DETECTOR OR AMPLIFIER

Walter Frederick Barlow, Milperra, near Sydney, New South Wales, Australia, assignor to Amalgamated Wireless (Australasia) Limited, Sydney, New South Wales, Australia Filed June 9, 1959, Ser. No. 819,118
Claims priority, application Australia July 15, 1958
4 Claims. (Cl. 330—29)

Figure 1:
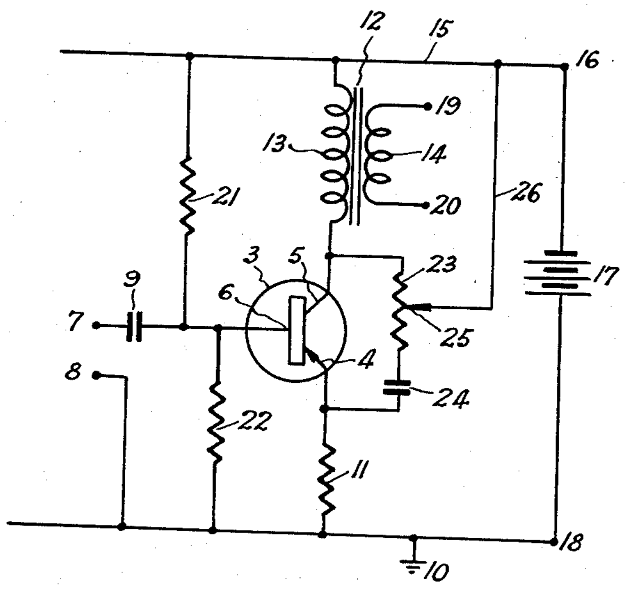

The invention relates to an improved transistor detector or amplifier and more particularly to an improved circuit arrangement in which a transistor may be caused to function as an amplifier or as a detector with improved operating characteristics.

In the past it has been the common practice in receivers employing transistors to use a simple diode as the detector. Due to the fact that the output from detectors of this type is usually insufficient to provide the required drive for the audio frequency output stage, an additional stage of audio amplification is generally used to amplify the detector output to the desired level. The necessity for using an additional audio frequency amplifying stage adds considerably to the cost of the receiver.

It has previously been suggested to use a transistor detector in place of the diode-amplifier combination. However, known forms of transistor detector compare unfavourably with the conventional diode detector and transistor amplifier arrangement, chiefly from the point of view of gain. The gain obtainable from known transistor detectors has been less than that obtained with the diode-amplifier combination. One reason for this loss of audio frequency gain is that the transistor detector has to be connected as an emitter follower in order to avoid over-loading when strong signals are applied.

Another important consideration in the design of transistorized receivers is the placement of the volume control network in the circuit. The most desirable location for the volume control in order to minimise the noise introduced into the circuit and to reduce the amount of distortion produced with gain control variation, is some point in the circuit after the first transistor audio amplifier.

The principal object of the present invention is to provide a transistor circuit which enables the transistor to function as a detector with improved gain and reduced distortion over known transistor detectors.

Another object of the invention is to provide a transistor circuit arrangement in which the transistor may be adapted to function as an audio amplifier with a gain controlled output and with improved operating characteristics.

A further object of the invention is to provide a transistor circuit which may be used for detection or amplification and in which a single gain control follows the transistor and gives adequate control of noise and gain with less distortion than known volume control arrangements.

The above objectives are achieved by the improved circuit of the present invention. According to the invention a volume control means is connected between the collector and emitter electrodes of the transistor in a transistor detector or amplifier in such a way as to simultaneously provide a complementary variation in the collector alternating current signal output load impedance and variations of the emitter current negative alternating current feedback due to variation of emitter circuit impedance, the arrangement being such that the collector alternating signal output load impedance is a maximum value and the emitter circuit degeneration a minimum or zero when in the maximum volume position at the emitter end of the volume control, and the collector alternating current signal output load impedance zero and the emitter circuit degeneration increased to an assignable maximum value when in the minimum volume position at the collector end of the volume control. At intermediate positions of the volume control simultaneous variation over the collector alternating current signal output load impedance and the emitter current negative alternating current feedback is provided.

Figure 2:
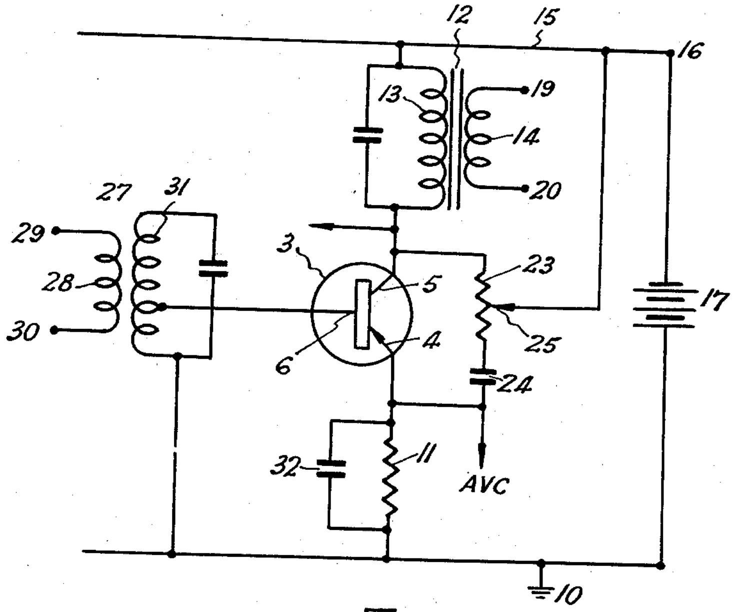

For a more complete understanding of the invention and the manner in which it is to be carried out attention is now directed to the following description in connection with the accompanying drawings, in which:

FIGURE 1 shows a transistor amplifier circuit arranged in accordance with the present invention, and FIGURE 2 shows the circuit arrangement of the present invention as applied to a transistor detector.

In order to simplify the description, only that portion of the circuit of a transistor receiver which is essential for an understanding of the invention is shown in FIGURES 1 and 2 of the drawing.

Referring now to FIGURE 1, the transistor 3 may be considered to be, for example, of the P-N-P junction type and includes an emitter 4, a collector 5 and a base electrode 6. The transistor 3 is connected for signal amplifying operation. An input signal derived from any convenient source of audio frequency signals (not shown) is applied across the input terminals 7—8. The input terminal 7 is connected to the base electrode 6 through an input coupling capacitor 9, and the input terminal 8 is connected via ground 10 and the emitter resistor 11 to the emitter electrode 4.

Amplified output energy from the transistor 3 is fed to a utilisation means, such as a succeeding stage of amplification, or a loud speaker (not shown) through an output transformer 12. The output transformer 12 has primary winding 13 and a secondary winding 14. One end of the primary winding 12 is connected to the collector electrode 5 and the other end of the primary winding 13 is connected to the negative terminal of a suitable D.C. potential supply source, such as for example the battery 17, through the conductor 15 and the terminal 16. The positive terminal 18 of the potential supply source 17 is connected to a point of reference potential or circuit ground 10.

One end of the secondary winding 14 is connected to the output terminal 19, and the other end of the secondary winding 14 is connected to the output terminal 20.

The negative terminal of the potential supply source 17 is also connected to ground 10, through a pair of voltage dividing resistors 21—22. The resistors 21—22 provide a relatively low current bleeder network. The junction between the resistors 21—22 is connected to the base 6 of the transistor 3. The resistance values of the resistors 21—22 are chosen to fix the base voltage at the required predetermined value.

To complete the circuit, in accordance with the present invention, one end of the resistance of a volume control potentiometer 23 is connected to the collector electrode 5 and the other end of the resistor 23 is connected through a blocking condenser 24 to the emitter electrode 4 of the transistor 3. The variable contact 25 of the potentiometer 23 is connected to the negative terminal 16 of the potential supply source 17 through the conductor 26.

In the operation of the circuit, incoming A.F. signals applied to the input terminals 7—8 may be obtained in amplified form at the output terminals 19—20. The amplitude of the signal energy at the output terminals 19—20 is controlled by the position of the moving contact 25 on the volume control potentiometer resistance 23. The moving contact 25 is in the maximum volume position when it is at the emitter end of the resistor 23 and the output may be cut off completely when the contact 25 is at the minimum volume or collector end of the resistor 23.

When the contact 25 is set at maximum the emitter is by-passed by means of the capacitor 24, all the audio load is in the collector circuit and the transistor 3 operates in a common emitter connection. This gives maximum gain, but the transistor 3 will only handle comparatively small signals. When the contact 24 is moved to the minimum volume or collector end of the resistance 23, the impedance of the alternating current load is reduced because of the increased shunting effect of the potentiometer resistor 23 between the collector 5 and the arm 25; at the same time the alternating current signal output voltage is further reduced due to the further reduction of gain caused by the increasing degenerative alternating current signal voltage developed across the impedance of the emitter circuit. The transistor will now handle large signals. Obviously at the absolute minimum setting of the contact 24 no signal or noise from the transistor will pass to the output terminals 19—20, since the primary 13 of the transformer 12 is short circuited.

Variation of the volume control contact 24 from the maximum to the minimum position automatically changes the circuit arrangement of the transistor 3 from the common emitter connection to the degenerative connection described, thereby providing optimum circuit conditions for the amplification of weak or strong input signal energy.

A further advantage associated with the circuit of the present invention is that as the volume control contacts 24 is moved from the maximum towards the minimum volume position to cope with input signals of increasing intensity, the amount of degeneration introduced into the circuit is simultaneously increased. This aids the volume control action and at the same time increases the correction for distortion as the input signal energy increases, thereby ensuring maximum linearity for strong signals, energy and minimum attenuation of weak input energy by degeneration.

In FIGURE 2, in which like parts are designated by similar reference characters, the invention is shown in its application to a transistor detector.

The circuit arrangement in FIGURE 2 differs from that in FIGURE 1 only in regard to the method of applying signal energy and biasing potentials to the base 6 of the transistor 3.

Input energy for the transistor 3 may be derived in conventional manner from any convenient source of modulated HF supply. In the present example the source of modulated HF supply is shown as the coupling transformer 27. The transformer 27 may be the coupling means between a source of incoming signal energy, such as an antenna or the coupling means in the output circuit of a preceding HF or IF amplifier. In the present example the modulated HF energy is fed to the primary winding 28 of the transformer 27 through the input terminals 29—30. One end of the secondary winding 31 is connected to the base 6 of the transistor 3 and the other end of the winding 31 is connected via ground 10 and the parallel connected emitter resistor 11 and high frequency by-pass capacitor 32 to the emitter electrode 4.

The potential divider 21—22 employed in FIGURE 1 to provide biasing potentials for the base 6 of the transistor 3 may be omitted from the transistor detector circuit arrangement shown in FIGURE 2. In FIGURE 2 the required biasing potential is provided by the emitter resistor 11. The value of the resistor 11 is selected to be such that the transistor 3 is biased to a point on its characteristic which is suitable for detection. The rest of the circuit incorporating the improvement of the present invention is the same as that shown in FIGURE 1.

Transistor detection may be divided into two phases. Initially the incoming modulated HF carrier is rectified by the emitter-base diode. The second phase of the detector process involves amplification of the audio modulation present on the original carrier. The position of the moving contact 25 on the resistor 23 functions in the manner previously described in connection with FIGURE 1 to control the amplitude of the amplified audio frequency energy available at the output terminals 19—20.

Where automatic gain control of transistor IF or RF amplifiers associated with the transistor detector 3 is used considerable power is required, such power may be readily obtained from the collector or emitter circuits of the transistor 3.

In the absence of incoming signals the potential at the emitter 4 with respect to ground is the product of the emitter current and the emitter resistor 11. The collector potential is the voltage applied to the collector, less the product of the collector current and collector circuit resistance. As the transistor is biased for detection, positive half cycles of incoming signal increase the emitter potential and cause an increase in the average emitter current. At the same time the average collector current increases causing its potential to fall.

Thus, the transistor detector 3 provides either a voltage increasing with carrier level at the emitter 4, or decreasing at the collector 5. These varying voltages provide suitable sources of A.G.C. power and may be taken from the emitter or collector electrodes as indicated in FIGURE 2, depending on the nature of the A.G.C. requirements of the receiver circuit.

Although a P-N-P type transistor has been used in the present example, an N-P-N type transistor may readily be substituted by simply reversing the polarity of the potential supply source 17.

I claim:

1. An electronic circuit arrangement comprising in combination a transistor including base, emitter and collector electrodes, means for applying an input signal between said base electrode and a point of reference potential in the circuit; a direct current supply source including a pair of terminals, one of said terminals being connected to said point of reference potential; a collector load impedance device connected between said collector electrode and the other of said terminals; a resistor connected between said emitter electrode and said point of reference potential; means for applying biasing potentials to said base electrode; a volume control resistor and a capacitor serially connected in the order named between said collector electrode and said emitter electrode, and a direct current conductive connection between a variable contact on said volume control resistor and said other terminal of said supply source to provide common emitter operation when said variable contact is adjusted on said volume control resistor to provide maximum volume output from said transistor, and degenerative emitter operation and variable output load impedance when said variable contact is adjusted on said volume control resistor to provide minimum volume output from said transistor.

2. An electronic circuit arrangement comprising in combination a transistor including base, emitter and collector electrodes; means for applying an input signal between said base electrode and a point of reference potential in the circuit; a direct current supply source including a pair of terminals, one of said terminals being connected to said point of reference potential; a collector load impedance device connected between said collector electrode and the other of said terminals, the parallel combination of a bias resistor and a high frequency bypass capacitor connected between said emitter and said point of reference potential; a volume control resistor and a capacitor serially conected in the order named between said collector electrode and said emitter electrode and a direct current conductive connection between a variable contact on said volume control resistor and said other terminal of said supply source to provide common emitter operation when said variable contact is adjusted on said volume control resistor to provide maximum volume output from said transistor, and degenerative emitter operation and variable output load impedance when said variable contact is adjusted on said volume control resistor to provide minimum volume output from said transistor.

3. An electronic circuit arrangement comprising in combination a transistor including base, emitter and collector electrodes; means for applying an input signal between said base electrode and a point of reference potential in the circuit; a direct current supply source including a pair of terminals, one of said terminals being connected to said point of reference potential; an output circuit including a low frequency coupling transformer having a primary and a secondary winding, one end of said primary winding being connected to said collector electrode and the other end of said primary winding being connected to the other of said terminals; a resistor connected between said emitter electrode and said point of reference potential; means including a resistance potentiometer connected between said terminals for applying biasing potentials to said base electrode; a volume control resistor and a capacitor serially connected in the order named between said collector-electrode and said emitter electrode and a direct current conductive connection between a variable contact on said volume control resistor and said other terminal of said supply source to provide common emitter operation when said variable contact is adjusted on said volume control resistor to provide maximum volume output from said transistor, and degenerative emitter operation and variable output load impedance when said variable contact is adjusted on said volume control resistor to provide minimum volume output from said transistor.

4. An electronic circuit arrangement comprising in combination a transistor including base emitter and collector electrodes; means for applying an input signal between said base electrode and a point of reference potential in the circuit; a direct current supply source including a pair of terminals, one of said terminals being connected to said point of reference potential; an output circuit including a low frequency coupling transformer having a primary and a secondary winding one end of said primary winding being connected to said collector electrode and the other end of said primary winding being connected to the other of said terminals; the parallel combination of a bias resistor and a high frequency bypass capacitor connected between said emitter and said point of reference potential; a volume control resistor and a capacitor serially connected in the order named between said collector electrode and said emitter electrode and a direct current conductive connection between a variable contact on said volume control resistor and said other terminal of said supply source to provide common emitter operation when said variable contact is adjusted on said volume control resistor to provide maximum volume output from said transistor, and degenerative emitter operation and variable output load impedance when said variable contact is adjusted on said volume control resistor to provide minimum volume output from said transistor.

References Cited in the file of this patent

UNITED STATES PATENTS 2,093,245 Van Loon ---------------- Sept. 14, 1937
2,878,380 Holmes ------------------ Mar. 17, 1959